US012785686B2

(12) United States Patent
Kao et al.

(10) Patent No.: US 12,785,686 B2
(45) Date of Patent: Nov. 3, 2026

(54) CIRCUIT WITH CALIBRATION FUNCTION AND CIRCUIT CALIBRATION METHOD

(71) Applicant: Realtek Semiconductor Corporation, Hsinchu (TW)

(72) Inventors: Hsueh-Yu Kao, Hsinchu (TW); Yi Feng, Hsinchu (TW); Chih-Lung Chen, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 59 days.

(21) Appl. No.: 19/006,144

(22) Filed: Dec. 30, 2024

(65) Prior Publication Data

US 2026/0058659 A1 Feb. 26, 2026

(30) Foreign Application Priority Data

Aug. 21, 2024 (TW) ................................ 113131495

(51) Int. Cl.
*H03K 19/00* (2006.01)
*H03K 19/0175* (2006.01)

(52) U.S. Cl.
CPC . *H03K 19/0005* (2013.01); *H03K 19/017545* (2013.01); *H03K 19/017581* (2013.01)

(58) Field of Classification Search
None
See application file for complete search history.

(56) References Cited

U.S. PATENT DOCUMENTS 12,602,068 B2 * 4/2026 Zhang ..................... G05F 1/567
2016/0226474 A1 * 8/2016 Roytman ............ H03F 3/45071
2023/0060647 A1 * 3/2023 Banerjee .................. G06F 1/06

OTHER PUBLICATIONS

Gang Jin et al., "A High-Accuracy RC Time Constant Auto-Tuning Scheme for Integrated Continuous-Time Filters," Micromachines 2024, 15(1):166, Jan. 2024.
Bo Xia et al., "An RC time constant auto-tuning structure for high linearity continuous-time ΣΔ modulators and active filters," in IEEE Transactions on Circuits and Systems I: Regular Papers, vol. 51, No. 11, pp. 2179-2188, Nov. 2004.

* cited by examiner

*Primary Examiner* — Jany Richardson
(74) *Attorney, Agent, or Firm* — CKC & Partners Co., LLC

(57) ABSTRACT

A circuit with calibration function includes a fully differential amplifier circuit, two voltage generation circuits, two multiplexers, a comparator and a digital logic circuit. The fully differential amplifier circuit amplifies a pair of differential input voltages to generate a pair of differential output voltages. One voltage generation circuit utilizes a first current to flow through a capacitor to generate a first voltage. The other voltage generation circuit utilizes a second current to flow through a resistor to generate a second voltage. The multiplexers provide the pair of differential output voltages or the first and second voltages to the comparator according to a digital control signal. The digital logic circuit generates a first digital code to adjust a capacitance of the capacitor or a second digital code to adjust DC voltage levels of the pair of differential output voltages according to the comparison signal provided by the comparator.

11 Claims, 6 Drawing Sheets

CIRCUIT WITH CALIBRATION FUNCTION AND CIRCUIT CALIBRATION METHOD

CROSS-REFERENCE TO RELATED APPLICATION

This application claims priority to Taiwan Application Serial Number 113131495, filed Aug. 21, 2024, which is herein incorporated by reference in its entirety.

BACKGROUND

Field of Invention

The present disclosure relates to a circuit with calibration function. More particularly, the present disclosure relates to a circuit with calibration function and a circuit calibration method.

Description of Related Art

Many conventional analog filters are implemented by designing the resistor-capacitor (RC) time constant related to resistance and capacitance of the circuit. However, limited by the current semiconductor manufacturing technology, the difference between the actual value of the RC time constant and the design value of the RC time constant may reach ±20% or even ±30%. Thus, an RC time constant calibration circuit (RCK) is usually added to correct the capacitance. However, such an added RCK has two main disadvantages. One is that the RCK usually requires a comparator, which increases the chip area and increases the manufacturing cost. The other is that the RCK requires the addition of a capacitor array, which increases the manufacturing cost, and there may be a mismatch between a capacitor array that originally needs to be corrected and the added capacitor array mentioned above, thereby causing errors.

In addition, the conventional analog filter or any circuit that includes an active amplifier or a pair of differential input terminals usually requires a DC offset calibration circuit (DCK). Such a DCK also requires a comparator, which likewise increases the chip area and increases the manufacturing cost.

SUMMARY

The present disclosure provides a circuit with calibration function. The circuit with calibration function includes a fully differential amplifier circuit, a first voltage generation circuit, a second voltage generation circuit, a first multiplexer, a second multiplexer, a comparator, and a digital logic circuit. The fully differential amplifier circuit is configured to amplify a pair of differential input voltages to generate a pair of differential output voltages. The first voltage generation circuit is configured to utilize a first current to flow through a capacitor to generate a first voltage. The second voltage generation circuit is configured to utilize a second current to flow through a resistor to generate a second voltage. The first multiplexer is coupled to the first voltage generation circuit and the fully differential amplifier circuit to respectively receive the first voltage and one of the pair of differential output voltages. The second multiplexer is coupled to the second voltage generation circuit and the fully differential amplifier circuit to respectively receive the second voltage and the other one of the pair of differential output voltages. The comparator is coupled to an output terminal of the first multiplexer and an output terminal of the second multiplexer to provide a comparison signal. The first multiplexer and the second multiplexer provide the pair of differential output voltages or the first and second voltages to the comparator according to a digital control signal. The digital logic circuit is coupled to the comparator to receive the comparison signal. The digital logic circuit generates a first digital code or a second digital code according to the comparison signal. The first digital code is used to adjust a capacitance of the capacitor and the second digital code is used to adjust DC voltage levels of the pair of differential output voltages.

The present disclosure further provides a circuit calibration method. The circuit calibration method includes amplifying a pair of differential input voltages to generate a pair of differential output voltages; utilizing a first current to flow through a capacitor to generate a first voltage; utilizing a second current to flow through a resistor to generate a second voltage; providing the pair of differential output voltages or the first and second voltages to the comparator according to a digital control signal, such that the comparator compares the pair of differential output voltages or the first and second voltages to provide a comparison signal; and generating a first digital code or a second digital code according to the comparison signal. The first digital code is used to adjust a capacitance of the capacitor and the second digital code is used to adjust DC voltage levels of the pair of differential output voltages.

The present disclosure further provides a circuit with calibration function. The circuit with calibration function includes a fully differential amplifier circuit, a first capacitor, a first resistor, a second capacitor, a second resistor, a first current source, a second current source, a first multiplexer, a second multiplexer, a comparator, and a digital logic circuit. The fully differential amplifier circuit has a first input terminal, a second input terminal, a first output terminal, and a second output terminal. The first capacitor is coupled between the first input terminal and the second output terminal through a first switch. The first resistor is coupled between the first input terminal and the second output terminal. The second capacitor is coupled between the second input terminal and the first output terminal. The second resistor is coupled between the second input terminal and the first output terminal through a second switch. The first current source is coupled to the first input terminal through a third switch. The second current source is coupled to the second input terminal through a fourth switch. The first multiplexer is coupled to the first input terminal and the second output terminal. The second multiplexer is coupled to the second input terminal and the first output terminal. The comparator is coupled to an output terminal of the first multiplexer and an output terminal of the second multiplexer to provide a comparison signal. The digital logic circuit is coupled to the comparator to receive the comparison signal. In an RC time constant calibration mode, the first multiplexer and the second multiplexer provide a signal of the first input terminal and a signal of the second input terminal to the comparator according to a digital control signal, and the digital logic circuit generates a first digital code according to the comparison signal to adjust a capacitance of the second capacitor.

In order to make the above features and advantages of the present disclosure more apparent and understandable, the following embodiments of the present disclosure, together with the accompanying drawings, are described in detail below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Specific embodiments of the present disclosure are further described in detail below with reference to the accompanying drawings. However, the embodiments described are not intended to limit the present disclosure and it is not intended for the description of operations to limit the order of implementation. The terms "first," "second," and "third" used in the specification should be understood as identifying units or data described by the same terminology, and do not refer to a particular order or sequence.

Figure 1:
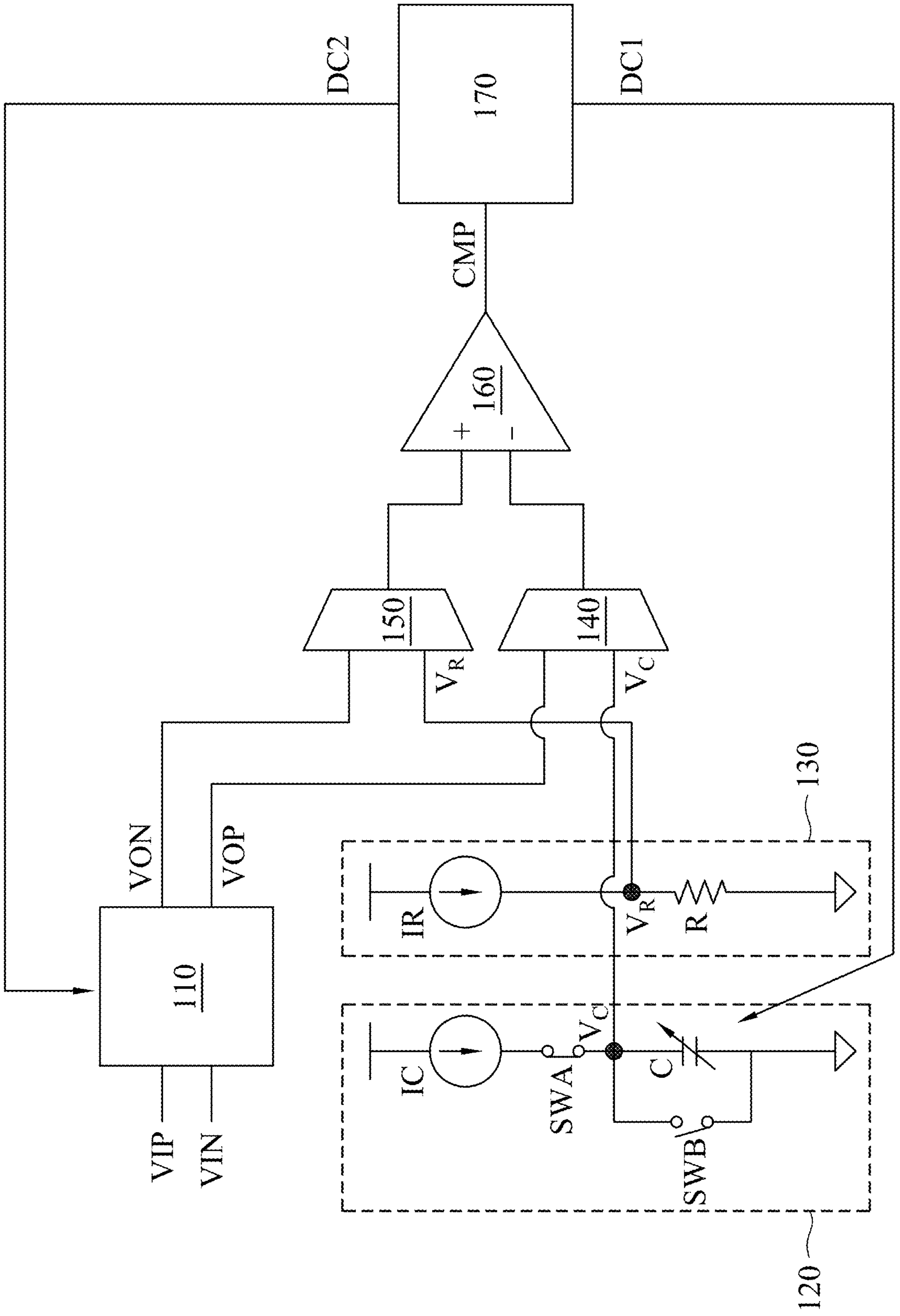
FIG. 1 is a circuit diagram of a circuit with calibration function according to a first embodiment of the present disclosure.

FIG. 1 is a circuit diagram of a circuit with calibration function according to a first embodiment of the present disclosure. As shown in FIG. 1, the circuit with calibration function includes a fully differential amplifier circuit 110, voltage generation circuits 120 and 130, multiplexers 140 and 150, a comparator 160, and a digital logic circuit 170. The fully differential amplifier circuit 110 amplifies a pair of differential input voltages VIP and VIN to generate a pair of differential output voltages VOP and VON.

The voltage generation circuit 120 includes a current source IC, a capacitor C, and switches SWA and SWB. The current source IC provides a current to the capacitor C. The switch SWA is coupled in series between the current source IC and the capacitor C. The switch SWB and the capacitor C are coupled in parallel. The voltage generation circuit 120 further includes a clock generation circuit (not shown in FIG. 1) to generate a first clock signal and a second clock signal. The first clock signal and the second clock signal do not overlap with each other. The switch SWA is controlled by the first clock signal. The switch SWB is controlled by the second clock signal. The first clock signal and the second clock signal are utilized to drive the voltage generation circuit 120 to generate a voltage $V_C$. Specifically, the voltage generation circuit 120 utilizes the current provided by the current source IC to flow through the capacitor C to generate the voltage $V_C$.

The voltage generation circuit 130 includes a current source IR and a resistor R. The current source IR is coupled in series with the resistor R and provides a current to the resistor R. Specifically, the voltage generation circuit 130 utilizes the current provided by the current source IR to flow through the resistor R to generate a voltage $V_R$.

Two input terminals of the multiplexer 140 are respectively coupled to the voltage generation circuit 120 and the fully differential amplifier circuit 110 to respectively receive the voltage $V_C$ and one of the pair of differential output voltages (e.g., the differential output voltage VOP as shown in FIG. 1). Two input terminals of the multiplexer 150 are respectively coupled to the voltage generation circuit 130 and the fully differential amplifier circuit 110 to respectively receive the voltage $V_R$ and the other one of the pair of differential output voltages (e.g., the differential output voltage VON as shown in FIG. 1). It is worth mentioning that the manner of connection of the input terminals of each of the multiplexers 140 and 150 as shown in FIG. 1 is merely an example. For example, connections may be changed such that the two input terminals of the multiplexer 140 may respectively receive the voltage $V_C$ and the differential output voltage VON, and the two input terminals of the multiplexer 150 may respectively receive the voltage $V_R$ and the differential output voltage VOP. As another example, connections may be changed such that the two input terminals of the multiplexer 140 may respectively receive the voltage $V_R$ (i.e., the multiplexer 140 is coupled to the voltage generation circuit 130) and the differential output voltage VOP, and the two input terminals of the multiplexer 150 may respectively receive the voltage VC (i.e., the multiplexer 150 is coupled to the voltage generation circuit 120) and the differential output voltage VON. As yet another example, the two input terminals of the multiplexer 140 may respectively receive the voltage $V_R$ and the differential output voltage VON, and the two input terminals of the multiplexer 150 may respectively receive the voltage $V_C$ and the differential output voltage VOP.

The operation of the circuit with calibration function as shown in FIG. 1 is divided into an RC time constant calibration mode and a DC offset calibration mode. The circuit with calibration function as shown in FIG. 1 provides the corresponding digital control signal (not shown in FIG. 1 and which may be provided by a digital control processor) to the multiplexers 140 and 150 according to the RC time constant calibration mode or the DC offset calibration mode. For example, the value of the digital control signal is expressed in binary form (0 or 1), and different values of the digital control signal respectively correspond to the RC time constant calibration mode and the DC offset calibration mode. In the RC time constant calibration mode, the multiplexers 140 and 150 provide voltages $V_C$ and $V_R$ to the comparator 160 according to the digital control signal corresponding to the RC time constant calibration mode. In the DC offset calibration mode, the multiplexers 140 and 150 provide the pair of differential output voltages VOP and VON to the comparator 160 according to the digital control signal corresponding to the DC offset calibration mode. In other words, the multiplexers 140 and 150 provide the pair of differential output voltages VOP and VON or provide the voltages $V_C$ and $V_R$ to the comparator 160 according to the digital control signal.

Two input terminals of the comparator 160 are respectively coupled to an output terminal of the multiplexer 140 and an output terminal of the multiplexer 150, and the comparator 160 compares two signals at two input terminals of the comparator 160, such that an output terminal of the comparator 160 provides a comparison signal CMP. In other words, in the RC time constant calibration mode, the comparator 160 receives the voltages $V_C$ and $V_R$ from the multiplexers 140 and 150 and compares the voltages $V_C$ and $V_R$ to provide the comparison signal CMP, and in the DC offset calibration mode, the comparator 160 receives the differential output voltages VOP and VON from the multiplexers 140 and 150 and compares the differential output voltages VOP and VON to provide the comparison signal CMP.

The digital logic circuit 170 is coupled to the comparator 160 to receive the comparison signal CMP. The digital logic circuit 170 generates a digital code DC1 or a digital code DC2 according to the comparison signal CMP. The digital code DC1 is provided to the capacitor C of the voltage generation circuit 120. The digital code DC2 is provided to the fully differential amplifier circuit 110.

In the first embodiment of the present disclosure, the above-mentioned digital control signal is also provided to the digital logic circuit 170. In the RC time constant calibration mode, the digital logic circuit 170 generates the digital code DC1 and supplies the same to the capacitor C according to the comparison signal CMP and the digital control signal corresponding to the RC time constant calibration mode, thereby adjusting the capacitance of the capacitor C until the voltage $V_C$ is equal to the voltage $V_R$. The RC time constant corresponding to the aforementioned adjusted capacitance of the capacitor C and a resistance of the resistor R reaches a predetermined value (e.g., the actual value of the RC time constant is equal to the predetermined designed value of the RC time constant), thereby realizing the calibration of the RC time constant. In the first embodiment of the present disclosure, the capacitor C is a variable-capacitance element and is a capacitor array including plural unit capacitors, and the digital code DC1 can be used to control on/off of these unit capacitors to correspondingly adjust the capacitance of the capacitor C.

Specifically, in the RC time constant calibration mode, the goal is to make the voltage $V_C$ equal to the voltage $V_R$. The voltage $V_C$ generated by the capacitor C is expressed by $V_C=(IC*T)/C$, in which IC represents the current provided by the current source IC, C represents the capacitance of the capacitor C, and T represents half of the period of the first clock signal and the second clock signal. The voltage $V_R$ generated by the resistor R is expressed by $V_R=IR*R$, in which IR represents the current provided by the current source IR, and R represents the resistance of the resistor R. Accordingly, it can be deduced that RC=(IC*T)/IR. Since IC, IR and T are all known values, the RC time constant RC is a fixed value. In other words, the manner of control of the RC time constant calibration mode is such that the digital logic circuit 170 is used to generate the digital code DC1 and supply the same to the capacitor C to control on/off of the unit capacitors contained in the capacitor C, thereby adjusting the capacitance of the capacitor C.

On the other hand, in the DC offset calibration mode, the digital logic circuit 170 generates the digital code DC2 and supplies the same to the fully differential amplifier circuit 110 according to the comparison signal CMP and the digital control signal corresponding to the DC offset calibration mode, thereby adjusting DC voltage levels of the pair of differential output voltages VOP and VON until the DC voltage levels of the pair of differential output voltages VOP and VON are equal to each other, and thus the DC offset calibration can be realized.

Specifically, in the conventional technology, if the circuit needs to have an RC time constant calibration function and a DC offset calibration function, it is necessary to add an RC time constant calibration circuit and a DC offset calibration circuit. These two calibration circuits require at least two comparators, resulting in larger circuit area and increased manufacturing cost. In contrast, the circuit with calibration function of the first embodiment of the present disclosure as shown in FIG. 1 has both the RC time constant calibration function and the DC offset calibration function, and these two functions can share the comparator 160 through the switching between the multiplexers 140 and 150, thereby saving the circuit area occupied by the comparator and saving manufacturing cost.

Figure 2:
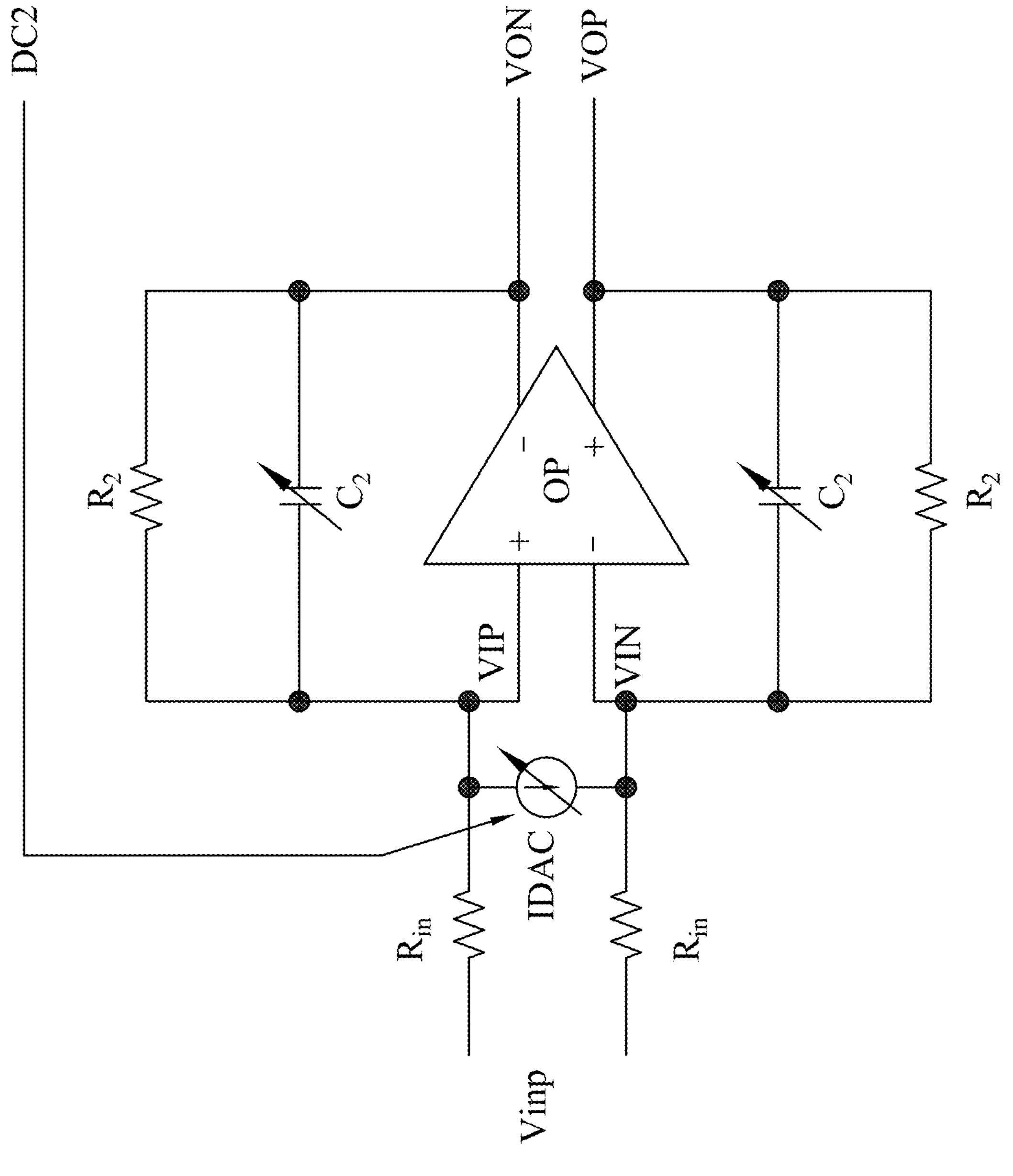
FIG. 2 is an exemplary circuit diagram of a fully differential amplifier circuit according to the first embodiment of the present disclosure.

FIG. 2 is an exemplary circuit diagram of the fully differential amplifier circuit 110 according to the first embodiment of the present disclosure. For example, as shown in FIG. 2, the fully differential amplifier circuit 110 includes a fully differential amplifier OP, two resistors $R_2$, and two capacitors $C_2$. The fully differential amplifier OP amplifies the pair of differential input voltages VIP and VIN to generate the pair of differential output voltages VOP and VON. Two input terminals of the fully differential amplifier OP that receive the pair of differential input voltages VIP and VIN are further coupled to a variable current source IDAC and two input resistors $R_{in}$. The input resistors $R_{in}$ receive an input voltage Vinp. As shown in FIG. 2, the digital code DC2 is used to adjust the current of the variable current source IDAC, thereby varying the current flowing through the resistors $R_2$ to adjust the DC voltage levels of the pair of differential output voltages VOP and VON. It should be noted that the circuit diagram of the fully differential amplifier circuit 110 as shown in FIG. 2 is merely an example, and the present disclosure is not limited thereto.

Figure 3:
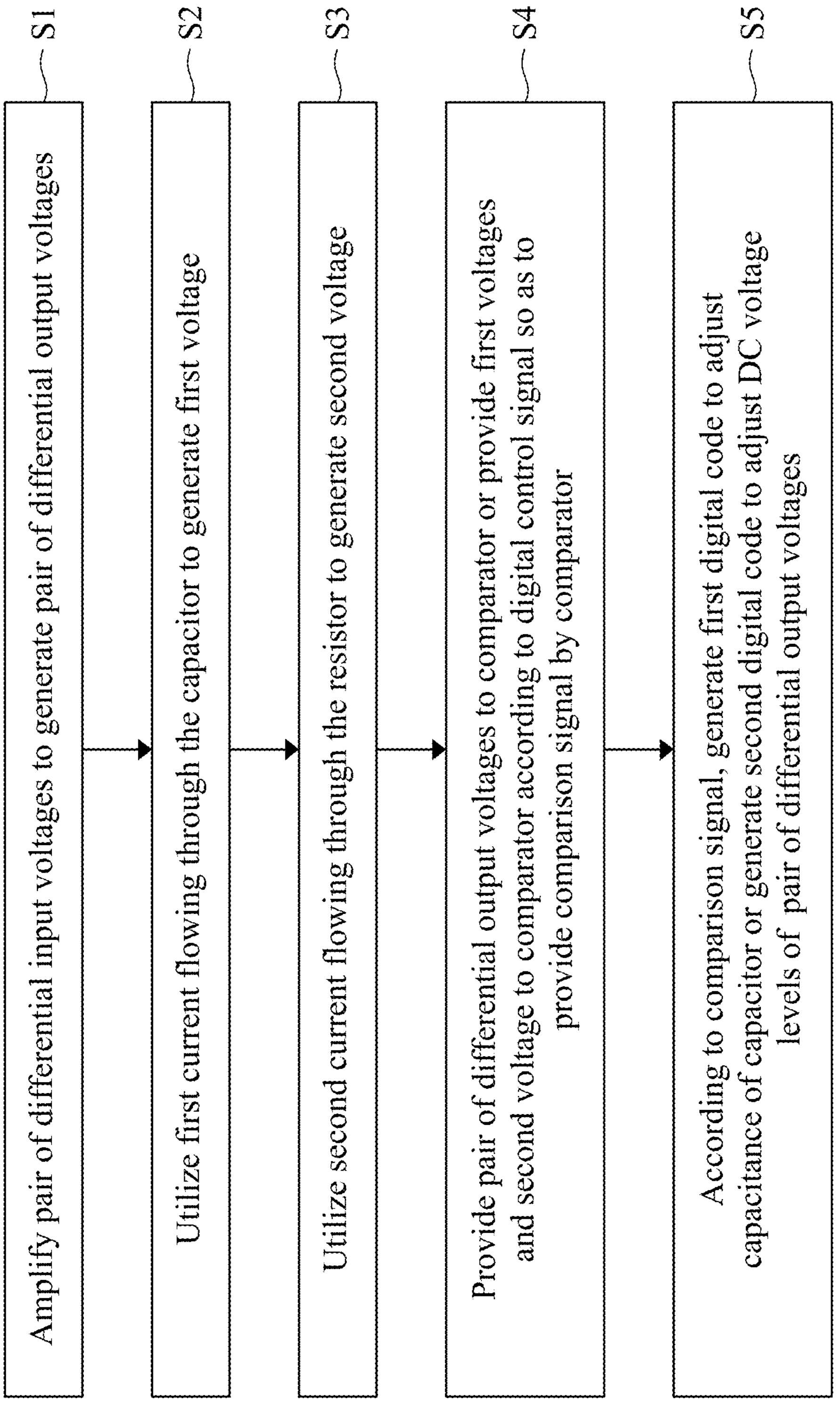
FIG. 3 is a flow chart of a circuit calibration method corresponding to the circuit with calibration function according to the first embodiment of the present disclosure.

FIG. 3 is a flow chart of a circuit calibration method corresponding to the circuit with calibration function according to the first embodiment of the present disclosure. Reference is made to FIG. 1 and FIG. 3. In Step S1, the fully differential amplifier circuit 110 amplifies the pair of differential input voltages VIP and VIN to generate the pair of differential output voltages VOP and VON. In Step S2, the voltage generation circuit 120 utilizes the current provided by the current source IC to flow through the capacitor C to generate the voltage $V_C$. In Step S3, the voltage generation circuit 130 utilizes the current provided by the current source IR to flow through the resistor R to generate the voltage $V_R$. In Step S4, the multiplexers 140 and 150 respectively provide the pair of differential output voltages VOP and VON or provide the voltages $V_C$ and $V_R$ to the comparator 160 according to the digital control signal corresponding to the RC time constant calibration mode or the DC offset calibration mode, so that the comparator 160 compares the pair of differential output voltages VOP and VON or provide the voltages $V_C$ and $V_R$ to provide the comparison signal CMP to the digital logic circuit 170. In Step S5, the digital logic circuit 170 correspondingly generates the digital code DC1 or the digital code DC2 according to the comparison signal CMP, in which the digital code DC1 is used to adjust the capacitance of the capacitor C and the digital code DC2 is used to adjust the DC voltage levels of the pair of differential output voltages VOP and VON.

Figure 4:
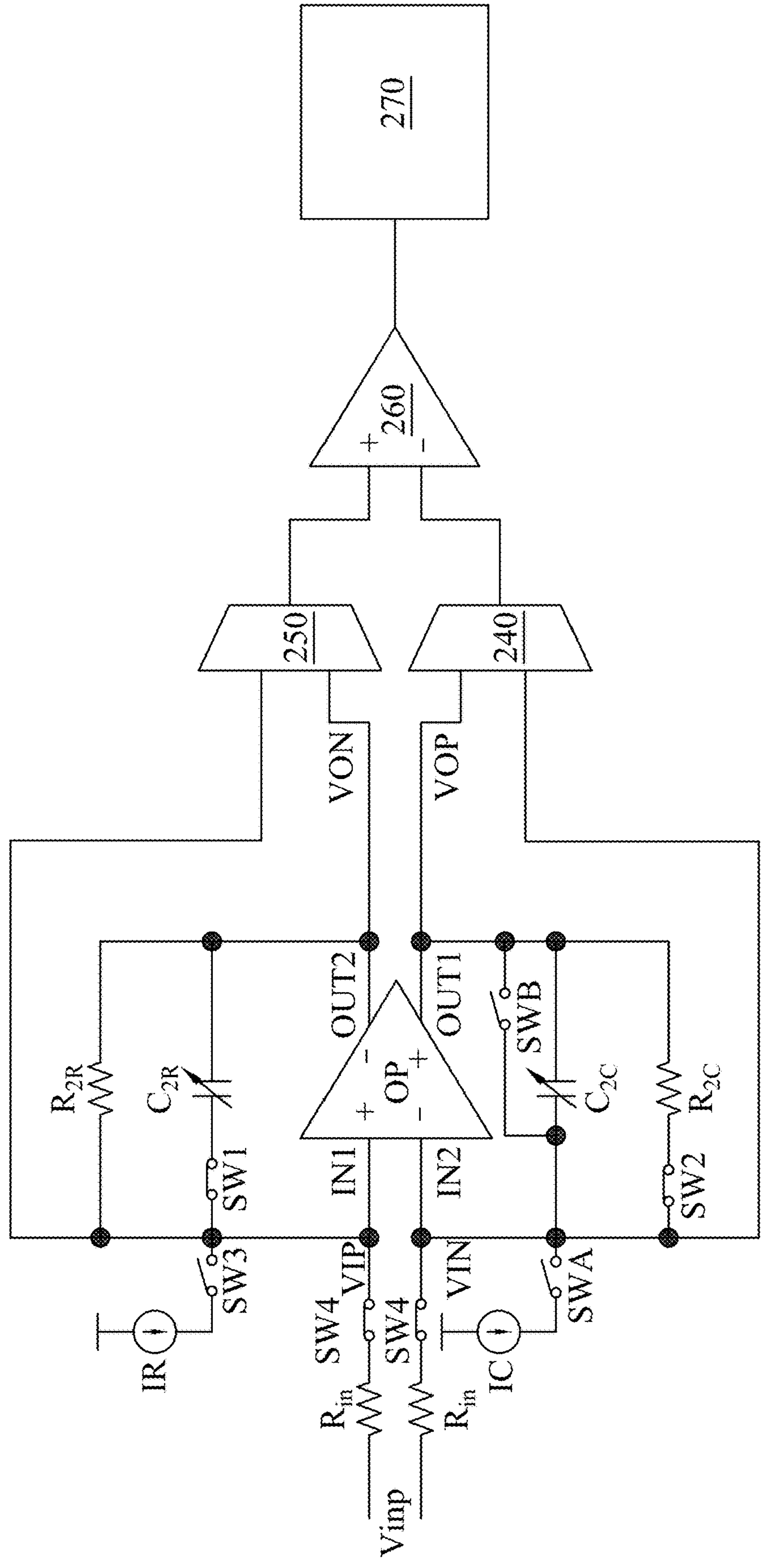
FIGS. 4-6 are circuit diagrams of a circuit with calibration function according to a second embodiment of the present disclosure.
Figure 5:
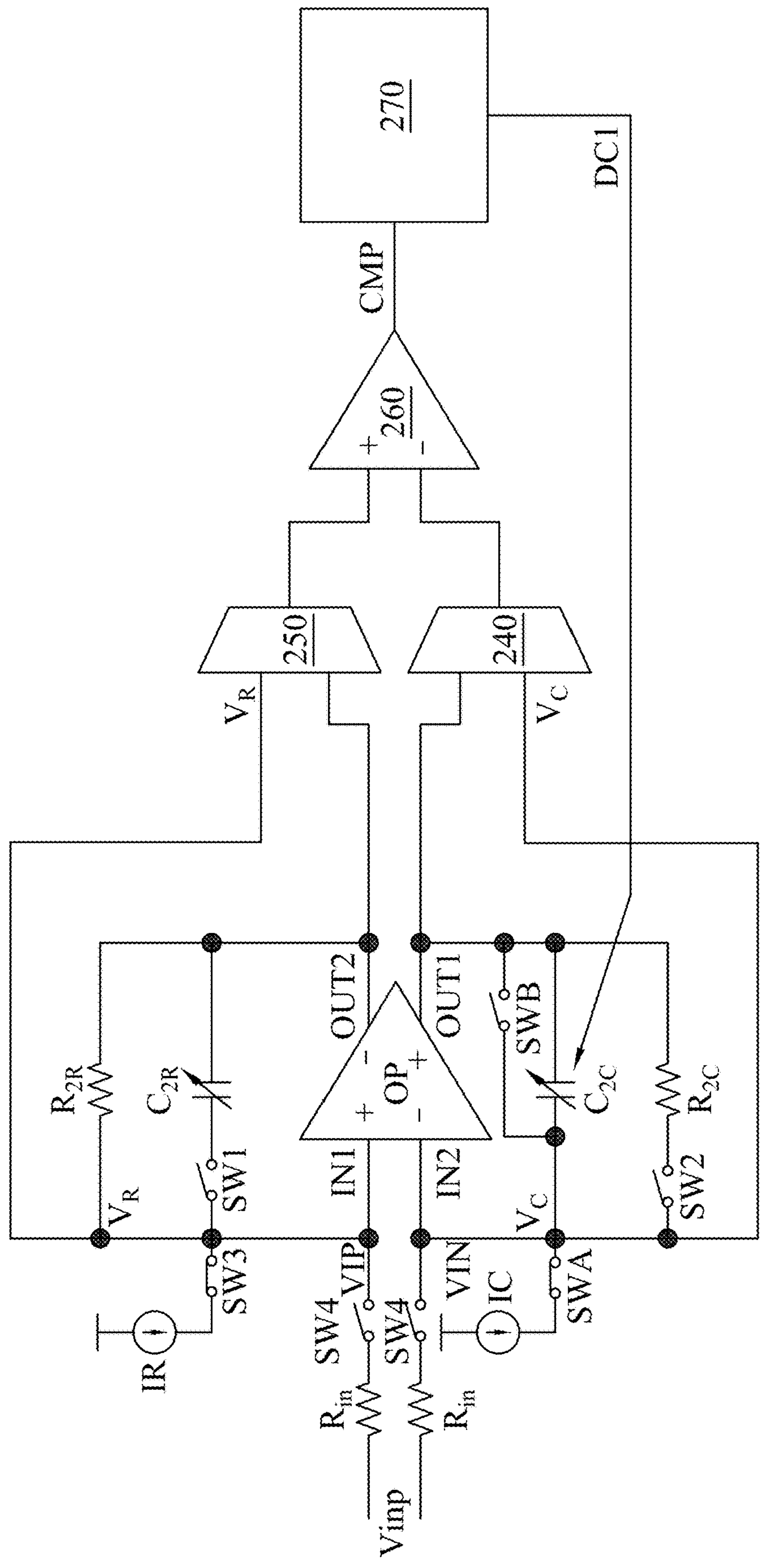

FIG. 4 and FIG. 5 are circuit diagrams of a circuit with calibration function according to a second embodiment of the present disclosure. As shown in FIG. 4 and FIG. 5, the circuit with calibration function includes a fully differential amplifier OP, two capacitors $C_{2R}$ and $C_{2C}$, two resistors $R_{2R}$ and $R_{2C}$, two current sources IR and IC, two multiplexers 240 and 250, a comparator 260, and a digital logic circuit 270.

As shown in FIG. 4 and FIG. 5, the fully differential amplifier OP has two input terminals IN1 and IN2 to receive a pair of differential input voltages VIP and VIN, and has two output terminals OUT1 and OUT2 to provide a pair of differential output voltages VOP and VON. Specifically, the fully differential amplifier OP amplifies the pair of differential input voltages VIP and VIN to generate the pair of differential output voltages VOP and VON. As shown in FIG. 4 and FIG. 5, the circuit with calibration function further includes two input resistors $R_{in}$, which are respectively coupled to the input terminals IN1 and IN2 of the fully differential amplifier OP through two switches SW4. Specifically, each of the input terminals IN1 and IN2 of the fully differential amplifier OP also receives an input voltage Vinp through the series-connected switches SW4 and the input resistors $R_{in}$.

As shown in FIG. 4 and FIG. 5, the capacitor $C_{2R}$ is coupled between the input terminal IN1 and the output terminal OUT2 of the fully differential amplifier OP through a switch SW1, the resistor $R_{2R}$ is coupled between the input terminal IN1 and the output terminal OUT2 of the fully differential amplifier OP, and the capacitor $C_{2C}$ is coupled between the input terminal IN2 and the output terminal OUT1 of the fully differential amplifier OP. A switch SWB and the capacitor $C_{2C}$ are coupled in parallel. The resistor $R_{2C}$ is coupled between the input terminal IN2 and the output terminal OUT1 of the differential amplifier OP through a switch SW2.

As shown in FIG. 4 and FIG. 5, the current source IR is coupled to the input terminal IN1 of the fully differential amplifier OP through a switch SW3, and the current source IC is coupled to the input terminal IN2 of the fully differential amplifier OP through a switch SWA.

As shown in FIG. 4 and FIG. 5, two input terminals of the multiplexer 250 are respectively coupled to the input terminal IN1 and the output terminal OUT2 of the fully differential amplifier OP, two input terminals of the multiplexer 240 are respectively coupled to the input terminal IN2 and the output terminal OUT1 of the fully differential amplifier OP, two input terminals of the comparator 260 are respectively coupled to an output terminal of the multiplexer 250 and an output terminal of the multiplexer 240, and the digital logic circuit 270 is coupled to the comparator 260.

In the second embodiment of the present disclosure, the operation of the circuit with calibration function as shown in FIG. 4 and FIG. 5 is divided into an analog filter mode and an RC time constant calibration mode (FIG. 4 corresponds to the analog filter mode, and FIG. 5 corresponds to the RC time constant calibration mode). The circuit with calibration function as shown in FIG. 4 and FIG. 5 provides the corresponding digital control signal (not shown in FIG. 4 and FIG. 5, and which may be provided by a digital control processor) to the multiplexers 140 and 150 according to the analog filter mode or the RC time constant calibration mode. For example, the value of the digital control signal is expressed in binary form (0 or 1), and different values of the digital control signal respectively correspond to the analog filter mode and the RC time constant calibration mode.

As shown in FIG. 4, in the analog filter mode, the switches SW1, SW2 and SW4 are turned on, and the switches SW3, SWA and SWB are turned off. At this time, the fully differential amplifier OP, the capacitors $C_{2R}$ and $C_{2C}$, the resistors $R_{2R}$ and $R_{2C}$, and the input resistors $R_{in}$ are equivalent to a first-order analog filter, and at this time, the circuit with calibration function as shown in FIG. 4 and FIG. 5 outputs (VOP−VON)/Vinp as the frequency response of said first-order analog filter.

As shown in FIG. 5, in the RC time constant calibration mode, the switches SW1, SW2 and SW4 are turned off, and the switch SW3 is turned on. The circuit with calibration function further includes a clock generation circuit (not shown in FIG. 5) to generate a first clock signal and a second clock signal, and the switch SWA is controlled by the first clock signal, the switch SWB is controlled by the second clock signal, and the first clock signal and the second clock signal do not overlap with each other. The first clock signal and the second clock signal are utilized to drive the current source IC and the capacitor $C_{2C}$ to generate the voltage $V_C$. In addition, at this time, the current source IR provides current to the resistor $R_{2R}$ to generate the voltage $V_R$.

As shown in FIG. 5, in the RC time constant calibration mode, the two input terminals of the multiplexer 240 are respectively coupled to the input terminal IN2 and the output terminal OUT1 of the fully differential amplifier OP to respectively receive the voltage $V_C$ and one of the pair of differential output voltages (e.g., the differential output voltage VOP as shown in FIG. 5). The two input terminals of the multiplexer 250 are respectively coupled to the input terminal IN1 and the output terminal OUT2 of the fully differential amplifier OP to respectively receive the voltage $V_R$ and the other one of the pair of differential output voltages (e.g., the differential output voltage VON as shown in FIG. 5). It is worth mentioning that the manner of connection of the input terminals of each of the multiplexers 240 and 250 as shown in FIG. 5 is merely an example. For example, connections may be changed such that the two input terminals of the multiplexer 240 may respectively receive the voltage $V_C$ and the differential output voltage VON, and the two input terminals of the multiplexer 250 may respectively receive the voltage $V_R$ and the differential output voltage VOP. As another example, connections may be change such that the two input terminals of the multiplexer 240 may respectively receive the differential output voltage VOP and the voltage $V_R$, and the two input terminals of the multiplexer 250 may respectively receive the voltage $V_C$ and the differential output voltage VON. As yet another example, the two input terminals of the multiplexer 240 may respectively receive the voltage $V_R$ and the differential output voltage VON, and the two input terminals of the multiplexer 250 may respectively receive the voltage $V_C$ and the differential output voltage VOP.

As shown in FIG. 5, in the RC time constant calibration mode, the multiplexers 240 and 250 respectively provide the voltages $V_C$ and $V_R$ of the two input terminals IN1 and IN2 of the fully differential amplifier OP to the comparator 260 according to the digital control signal corresponding to the RC time constant calibration mode. The comparator 260 respectively receives the voltages $V_C$ and $V_R$ from the multiplexers 240 and 250 and correspondingly provides the comparison signal CMP. The digital logic circuit 270 is coupled to the comparator 260 to receive the comparison signal CMP, thereby generating the digital code DC1 to supply the same to the capacitor $C_{2C}$ according to the comparison signal CMP.

In the second embodiment of the present disclosure, the above-mentioned digital control signal is also provided to the digital logic circuit 270. As shown in FIG. 5, in the RC time constant calibration mode, the digital logic circuit 270 generates the digital code DC1 and supplies the same to the capacitor $C_{2C}$ according to the comparison signal CMP and the digital control signal corresponding to the RC time constant calibration mode, thereby adjusting the capacitance of the capacitor $C_{2C}$ until the voltage $V_C$ is equal to the voltage $V_R$. The RC time constant corresponding to the aforementioned adjusted capacitance of the capacitor $C_{2C}$ and the resistance of the resistor $R_{2R}$ reaches a predetermined value (e.g., the actual value of the RC time constant is equal to the predetermined designed value of the RC time constant), thereby realizing the calibration of the RC time constant. In the second embodiment of the present disclosure, the capacitor $C_{2C}$ is a variable-capacitance element and is a capacitance array including plural unit capacitors, and the digital code DC1 can be used to control on/off of these unit capacitors to correspondingly adjust the capacitance of the capacitor $C_{2C}$.

Specifically, in the conventional technology, if the analog filter needs to have an RC time constant calibration function, it is necessary to add an RC time constant calibration circuit. This RC time constant calibration circuit requires an additional capacitor array, resulting in larger circuit area and increased manufacturing cost. In addition, there may be a mismatch between this additional capacitor array of the RC time constant calibration circuit and a capacitor array that originally needs to be corrected. In contrast, the circuit with calibration function of the second embodiment of the present disclosure as shown in FIG. 4 and FIG. 5 share the capacitor array used for the analog filter and the RC time constant calibration function, thereby saving the circuit area and the manufacturing cost and avoiding possible mismatch between the additional capacitor array and a capacitor array that originally needs to be corrected.

Figure 6:
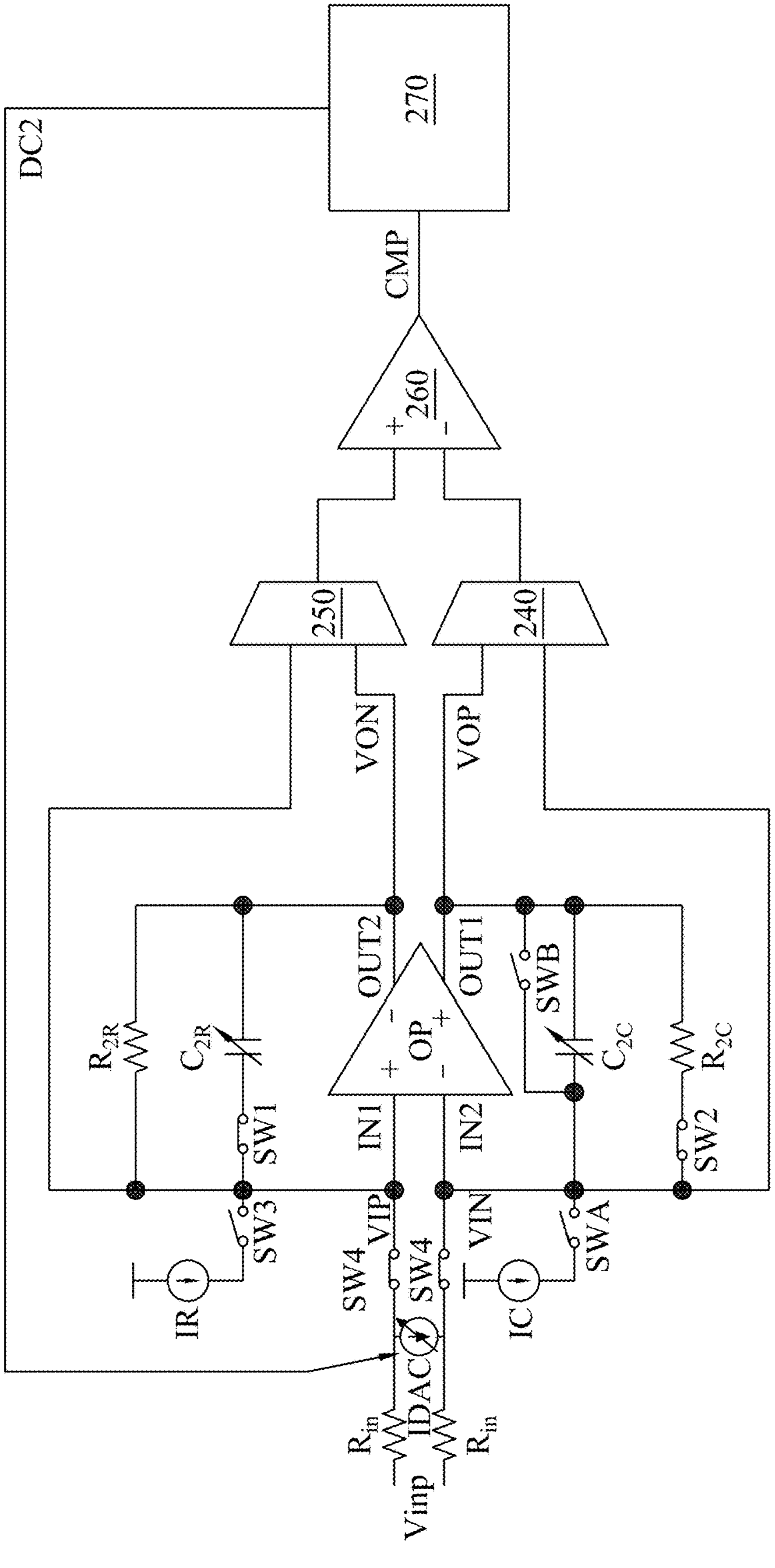

In the second embodiment of the present disclosure, the operation of the circuit with calibration function can also be divided into the RC time constant calibration mode and the DC offset calibration mode (FIG. 5 corresponds to the RC time constant calibration mode, and FIG. 6 corresponds to the DC offset calibration mode). The circuit with calibration function provides the corresponding digital control signal to the multiplexers 240 and 250 according to the RC time constant calibration mode or the DC offset calibration mode. For example, the value of the digital control signal is expressed in binary form (0 or 1), and different values of the digital control signal respectively correspond to the RC time constant calibration mode and the DC offset calibration mode.

As shown in FIG. 6, in the DC offset calibration mode, the multiplexers 240 and 250 respectively provide the pair of differential output voltages VOP and VON of the two output terminals OUT1 and OUT2 of the fully differential amplifier OP to the comparator 260 according to the digital control signals corresponding to the DC offset calibration mode. The comparator 260 respectively receives the pair of differential output voltages VOP and VON from the multiplexers 240 and 250, and the comparator 260 compares the pair of differential output voltages VOP and VON to provide the comparison signal CMP. The digital logic circuit 270 generates the digital code DC2 according to the comparison signal CMP and the digital control signal corresponding to the DC offset calibration mode, thereby adjusting the DC voltage levels of the pair of differential output voltages VOP and VON until the DC voltage levels of the pair of differential output voltages VOP and VON are equal to each other, and thus the DC offset calibration can be realized. As shown in FIG. 6, the input terminals IN1 and IN2 of the fully differential amplifier OP are further coupled to a variable current source IDAC. The digital code DC2 is used to adjust the current of the variable current source IDAC, thereby varying the current flowing through the resistors $R_{2R}$ and $R_{2C}$ to adjust the DC voltage levels of the pair of differential output voltages VOP and VON.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims.

What is claimed is:

1. A circuit with calibration function, the circuit comprising:

a fully differential amplifier circuit configured to amplify a pair of differential input voltages to generate a pair of differential output voltages;

a first voltage generation circuit configured to utilize a first current to flow through a capacitor to generate a first voltage;

a second voltage generation circuit configured to utilize a second current to flow through a resistor to generate a second voltage;

a first multiplexer coupled to the first voltage generation circuit and the fully differential amplifier circuit to respectively receive the first voltage and one of the pair of differential output voltages;

a second multiplexer coupled to the second voltage generation circuit and the fully differential amplifier circuit to respectively receive the second voltage and the other one of the pair of differential output voltages;

a comparator coupled to an output terminal of the first multiplexer and an output terminal of the second multiplexer to provide a comparison signal, wherein the first multiplexer and the second multiplexer provide the pair of differential output voltages or the first and second voltages to the comparator according to a digital control signal; and a digital logic circuit coupled to the comparator to receive the comparison signal, wherein the digital logic circuit generates a first digital code or a second digital code according to the comparison signal, wherein the first digital code is used to adjust a capacitance of the capacitor and the second digital code is used to adjust DC voltage levels of the pair of differential output voltages.

2. The circuit of claim 1, wherein in an RC time constant calibration mode, the first multiplexer and the second multiplexer provide the first voltage and the second voltage to the comparator according to the digital control signal, and the digital logic circuit generates the first digital code according to the comparison signal to adjust the capacitance of the capacitor until the first voltage is equal to the second voltage, wherein an RC time constant corresponding to the adjusted capacitance of the capacitor and a resistance of the resistor reaches a predetermined value.

3. The circuit of claim 1, wherein in a DC offset calibration mode, the first multiplexer and the second multiplexer provide the pair of differential output voltages to the comparator according to the digital control signal, and the digital logic circuit generates the second digital code according to the comparison signal to adjust the DC voltage levels of the pair of differential output voltages until the DC voltage levels of the pair of differential output voltages are equal to each other.

4. The circuit of claim 1, wherein the first voltage generation circuit comprises a first current source to provide the first current to the capacitor, wherein the second voltage generation circuit comprises a second current source coupled in series to the resistor, wherein the second current source provides the second current to the resistor.

5. The circuit of claim 4, wherein the first voltage generation circuit comprises:

a first switch coupled in series between the first current source and the capacitor; and a second switch coupled in parallel with the capacitor.

6. The circuit of claim 5, wherein the first switch is controlled by a first clock signal and the second switch is controlled by a second clock signal, and the first clock signal and the second clock signal do not overlap with each other.

7. The circuit of claim 1, wherein the capacitor is a capacitor array including a plurality of unit capacitors, wherein the first digital code is used to control on/off of the unit capacitors to adjust the capacitance of the capacitor.

8. A circuit calibration method, comprising:

amplifying a pair of differential input voltages to generate a pair of differential output voltages;

utilizing a first current to flow through a capacitor to generate a first voltage;

utilizing a second current to flow through a resistor to generate a second voltage;

providing the pair of differential output voltages or the first and second voltages to a comparator according to a digital control signal, such that the comparator compares the pair of differential output voltages or the first and second voltages to provide a comparison signal; and generating a first digital code or a second digital code according to the comparison signal, wherein the first digital code is used to adjust a capacitance of the capacitor and the second digital code is used to adjust DC voltage levels of the pair of differential output voltages.

9. The circuit calibration method of claim 8, further comprising:

providing, in an RC time constant calibration mode, the first voltage and the second voltage to the comparator according to the digital control signal, and generating the first digital code according to the comparison signal to adjust the capacitance of the capacitor until the first voltage is equal to the second voltage, wherein an RC time constant corresponding to the adjusted capacitance of the capacitor and a resistance of the resistor reaches a predetermined value.

10. The circuit calibration method of claim 8, further comprising:

providing, in a DC offset calibration mode, the pair of differential output voltages to the comparator according to the digital control signal, and generating the second digital code according to the comparison signal to adjust the DC voltage levels of the pair of differential output voltages until the DC voltage levels of the pair of differential output voltages are equal to each other.

11. The circuit calibration method of claim 8, further comprising:

utilizing, in an RC time constant calibration mode, the first digital code to control on/off of a plurality of unit capacitors included in the capacitor, thereby adjusting the capacitance of the capacitor.

* * * * *